United States Patent
Yang et al.

(10) Patent No.: US 10,483,410 B2
(45) Date of Patent: Nov. 19, 2019

(54) FORMING FRONT METAL CONTACT ON SOLAR CELL WITH ENHANCED RESISTANCE TO STRESS

(71) Applicant: Alta Devices, Inc., Sunnyvale, CA (US)

(72) Inventors: Linlin Yang, Sunnyvale, CA (US); Liguang Lan, Sunnyvale, CA (US); Chris France, Sunnyvale, CA (US); Gang He, Sunnyvale, CA (US); Erhong Li, Sunnyvale, CA (US); Jose Corbacho, San Jose, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 0 days.

(21) Appl. No.: 14/918,043

(22) Filed: Oct. 20, 2015

(65) Prior Publication Data

US 2017/0110603 A1   Apr. 20, 2017

(51) Int. Cl.
*H01L 31/18* (2006.01)
*H01L 31/048* (2014.01)
(Continued)

(52) U.S. Cl.
CPC ........ *H01L 31/022425* (2013.01); *H01L 31/022433* (2013.01); *H01L 31/0304* (2013.01);
(Continued)

(58) Field of Classification Search
CPC ......... H01L 31/022425; H01L 31/0445; H01L 31/0304; H01L 31/048; H01L 31/0516;
(Continued)

(56) References Cited

U.S. PATENT DOCUMENTS

| | | | | |
|---|---|---|---|---|
| 4,667,059 A | * | 5/1987 | Olson | ............... H01L 31/03046 |
| | | | | 136/249 |
| 5,009,719 A | * | 4/1991 | Yoshida | .......... H01L 31/022425 |
| | | | | 136/249 |

(Continued)

FOREIGN PATENT DOCUMENTS

EP     2 068 372 A1    6/2009
WO   WO 2009/011791 A2   1/2009

OTHER PUBLICATIONS

International Search Report and Written Opinion issued in PCT/US2016/057752 dated Jan. 19, 2017.
(Continued)

*Primary Examiner* — Uyen M Tran
(74) *Attorney, Agent, or Firm* — Arent Fox, LLP

(57) ABSTRACT

System and method of providing a photovoltaic (PV) cell having a cushion layer to alleviate stress impact between a front metal contact and a thin film PV layer. A cushion layer is disposed between an extraction electrode and a photovoltaic (PV) surface. The cushion layer is made of a nonconductive material and has a plurality of vias filled with a conductive material to provide electrical continuity between the bus bar and the PV layer. The cushion layer may be made of a flexible material preferably with rigidity that matches the substrate. Thus, the cushion layer can effectively protect the PV layer from physical damage due to tactile contact with the front metal contact.

6 Claims, 8 Drawing Sheets

(51) Int. Cl.
*H01L 31/0224* (2006.01)
*H01L 31/0445* (2014.01)
*H01L 31/0304* (2006.01)
*H01L 31/05* (2014.01)
*H01L 31/0693* (2012.01)

(52) U.S. Cl.
CPC ........ *H01L 31/048* (2013.01); *H01L 31/0445* (2014.12); *H01L 31/0512* (2013.01); *H01L 31/0516* (2013.01); *H01L 31/0693* (2013.01); *H01L 31/18* (2013.01); *Y02E 10/544* (2013.01); *Y02P 70/521* (2015.11)

(58) Field of Classification Search
CPC ............. H01L 31/18; H01L 31/022433; H01L 31/0512; H01L 31/0693
See application file for complete search history.

(56) References Cited

U.S. PATENT DOCUMENTS

| | | | | |
|---|---|---|---|---|
| 5,021,100 | A * | 6/1991 | Ishihara | H01L 31/022466 136/249 |
| 6,613,603 | B1 * | 9/2003 | Sano | H01L 31/022483 136/252 |
| 2008/0053522 | A1 * | 3/2008 | Basol | H01L 31/0749 136/256 |
| 2010/0084001 | A1 * | 4/2010 | Tsunomura | H01L 31/0747 136/244 |
| 2011/0030756 | A1 * | 2/2011 | Honda | C09J 7/021 136/244 |
| 2011/0139212 | A1 | 6/2011 | Hong et al. | |
| 2013/0048336 | A1 | 2/2013 | Malik | |
| 2013/0087824 | A1 * | 4/2013 | Van Den Brand | H01L 51/448 257/99 |
| 2013/0284232 | A1 * | 10/2013 | Fukumochi | H01L 31/0201 136/244 |
| 2014/0069479 | A1 * | 3/2014 | Yang | H01L 31/0201 136/244 |
| 2014/0190545 | A1 * | 7/2014 | Lei | H01L 31/048 136/244 |
| 2015/0068596 | A1 | 3/2015 | Ibara et al. | |

OTHER PUBLICATIONS

European communication pursuant to Article 94(3) EPC [office action] corresponding to EP Application No. 16787669.4, dated Apr. 30, 2019.

* cited by examiner

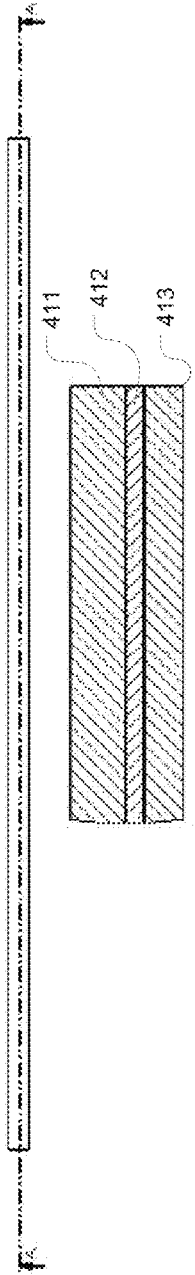
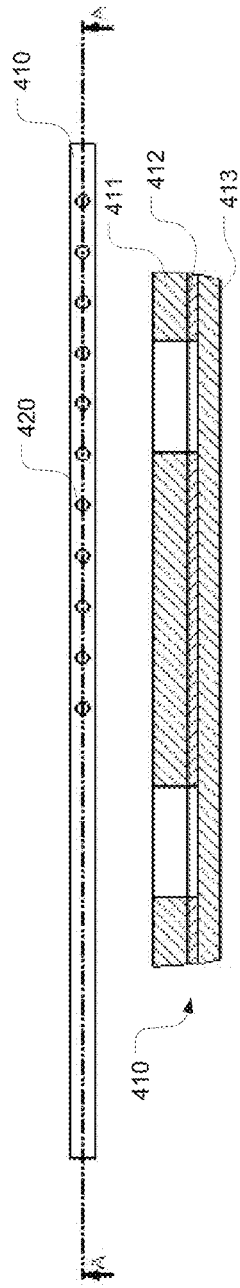
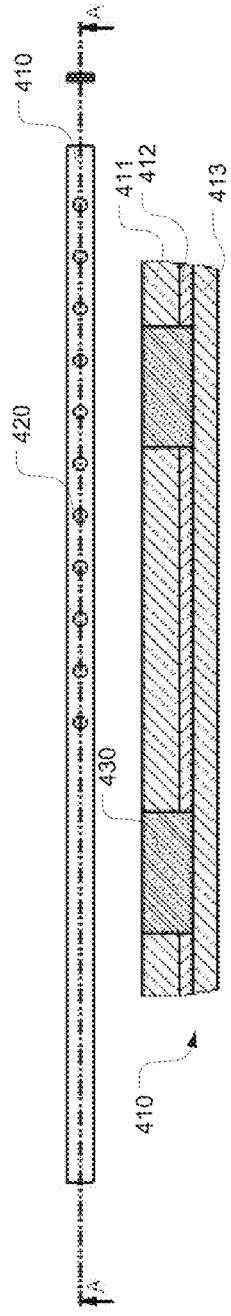
FIG. 4A
FIG. 4B
FIG. 4C

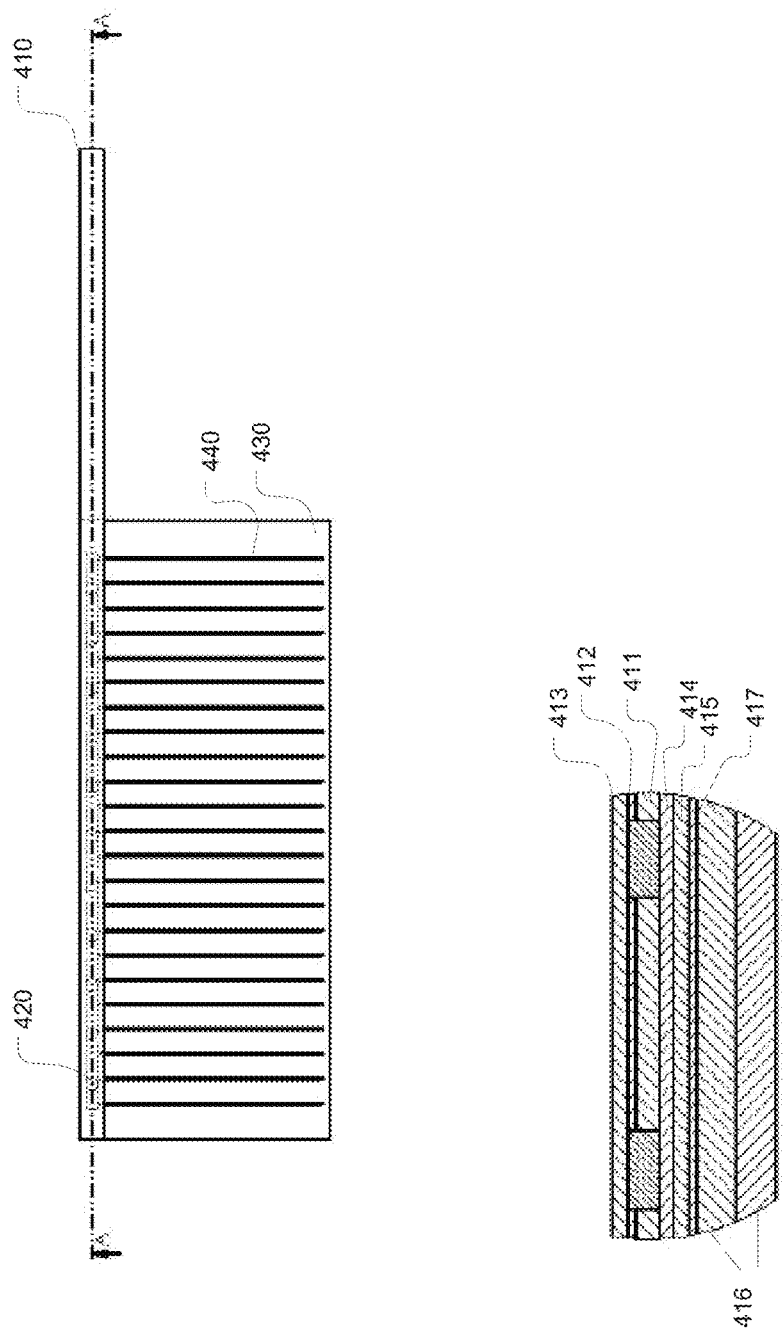

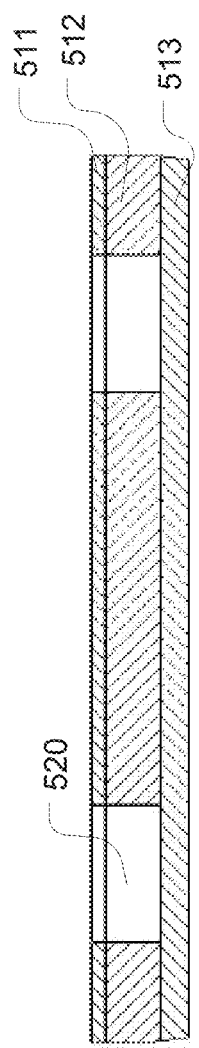
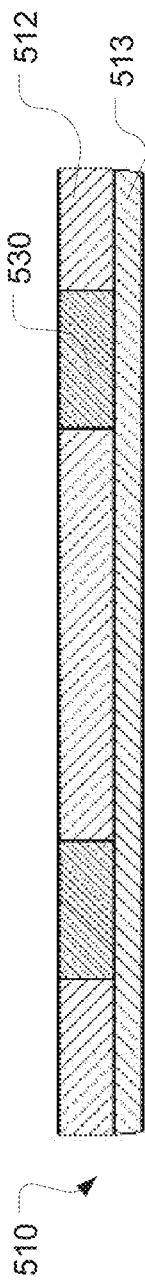
FIG. 5A
FIG. 5B

FORMING FRONT METAL CONTACT ON SOLAR CELL WITH ENHANCED RESISTANCE TO STRESS

TECHNICAL FIELD

The present disclosure relates generally to the field of photovoltaic devices, and, more specifically, to the field of contact metallization on photovoltaic devices.

BACKGROUND

A solar cell or photovoltaic (PV) cell is an electrical device that converts the energy of light directly into electricity by photovoltaic effect. Energy generated from solar cellsoffers renewable, environmentally friendly and readily available alternatives to fossil fuels. Typically a solar cell utilizes semiconductor materials in the form of a p-n junction for energy conversion. Metal layers are laid on the surface of the semiconductor materials to conduct the produced voltage and current to external circuitry for power storage or transportation, e.g. through contact with a metal wire (or referred to as "front metal contact" herein) laid on top of the extraction electrode. In a typical configuration, the front metal layer of a PV cell includes a number of discrete electrodes interspersed on the front surface of the PV cell and an extraction electrode connected to all the discrete electrodes for collecting the current therefrom. An array of solar cells can be interconnected and assembled into a solar module or a solar panel to aggregate the current generated by the individual solar cells.

With the ever increasing popularity of portable electronic devices, demands for flexible solar modules have dramatically increased as they can be easily integrated into the electronic devices. Due to size and weight restriction imposed by these electronic devices, solar modules of small volumes offering high efficiency and high flexibility are preferred. It has been established that single crystalline solar cells have outstanding conversion efficiency among the large variety of PV materials that have been developed.

Unfortunately, single crystalline materials are brittle by nature and tend to break or otherwise generate defects under stress. Traditionally, a front metal contact disposed on top of a PV cell is commonly made of a metal strip (or metal wire or ribbon) which is far more rigid than a crystalline PV layer. Even very low stress can cause micro-cracks and other defects on the crystalline layer. The undesired stress may stem from lamination damage, material mismatch (e.g., coefficient of thermal expansion (CTE) mismatch), external forces, bending, and etc. Defects in a PV layer may lead to hot spots and eventually PV cell efficiency degradation. For example, a solar cell with a flexible substrate can be easily bent or otherwise deformed when subject to an external pressure, e.g., during the processes of manufacturing, assembling or installation of solar modules. When being deformed, the crystalline PV layer is subject to stress impact from the metal strip and is prone to physical damage.

FIG. 1 illustrates the crosssection of a PV device 100 along an extraction electrode of the cell in accordance with the prior art. The PV device 100 includes an encapsulation layer 110, a front metal contact 120, a front metal layer 125, a PV layer 130, a back metal layer 140 and a substrate (or carrier layer) 150. The encapsulation layer 110 is the top surface of the PV device 100 and intended to receive light beams when the PV cell is in use. The front metal layer 125, the PV layer, the back metal layer 140 and the substrate 150 are collectively referred to as the PV cell. The front metal layer 125 corresponds to an extraction electrode (or known as a "bus bar") of the PV cell. For example, the front metal layer 125 is formed by electroplating. The front metal contact is disposed on top of the front metal layer 125 and made of a metal strip composed primarily of Cu.

According to the conventional front contact metallization approach, the front metal contact is in direct contact with the PV cell. The PV layer is fabricated as a crystalline thin film structure and is less rigid than the metal contact. The mismatch in material rigidity between the PV cell and the front metal contact tends to cause defects or other damages in the PV layer 130, especially the area under the extraction electrode due to its greater size than the discrete electrodes.

SUMMARY OF THE INVENTION

Therefore, it would be advantageous to provide crystalline solar modules capable of protecting the photovoltaic layers from physical damage due to stress exerted through front contact metallization.

Embodiments of the present disclosure utilize a cushion layer disposed between a front metal contact and a photovoltaic (PV) cell to alleviate stress impact from the metal contact imposed on the PV cell. In some embodiments, a front metal contact is disposed on top of an extraction electrode of a PV cell, which is part of the front contact grid of the PV cell. The cushion layer is made of a nonconductive material and has a plurality of vias filled with a conductive material to provide electrical continuity between the front metal contact and the extraction electrode. In some embodiments, the solar cell has a thin film single crystalline PV layer and a flexible substrate. Accordingly, the cushion layer is made of a flexible material preferably with a rigidity or hardness that matches the substrate.

Combining a front metal contact with a cushion layer can effectively reduce stress impact from the metal contact imposed on the underlying crystalline PV cell despite the rigidity mismatch between the PV layer and the metal contact. Consequently, the risk of physical damage on the PV layer is advantageously and significantly reduced, contributing to improved flexibility and reliability of the solar devices.

According to one embodiment, a photovoltaic assembly includes: a PV cell configured to convert light energy to electrical energy; a front contact layer disposed on top of the PV cell; a cushion layer disposed between the front contact layer and the PV cell; and a substrate. The front contact layer is configured to conduct electrical current originated from the PV layer of the PV cell to external circuitry. The cushion layer is less rigid than the front contact layer.

The foregoing is a summary and thus contains, by necessity, simplifications, generalization and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

Embodiments of the present invention will be better understood from a reading of the following detailed description, taken in conjunction with the accompanying drawing figures in which like reference characters designate like elements and in which:

FIGS. 4A-4D illustrate an exemplary process of integrating a cushion layer between a front metal contact and a PV cell in accordance with an embodiment of the present disclosure;

FIGS. 5A-5C illustrate another exemplary process of integrating a cushion layer between a front metal contact and a PV cell in accordance with an embodiment of the present disclosure.

DETAILED DESCRIPTION

Figure 1:
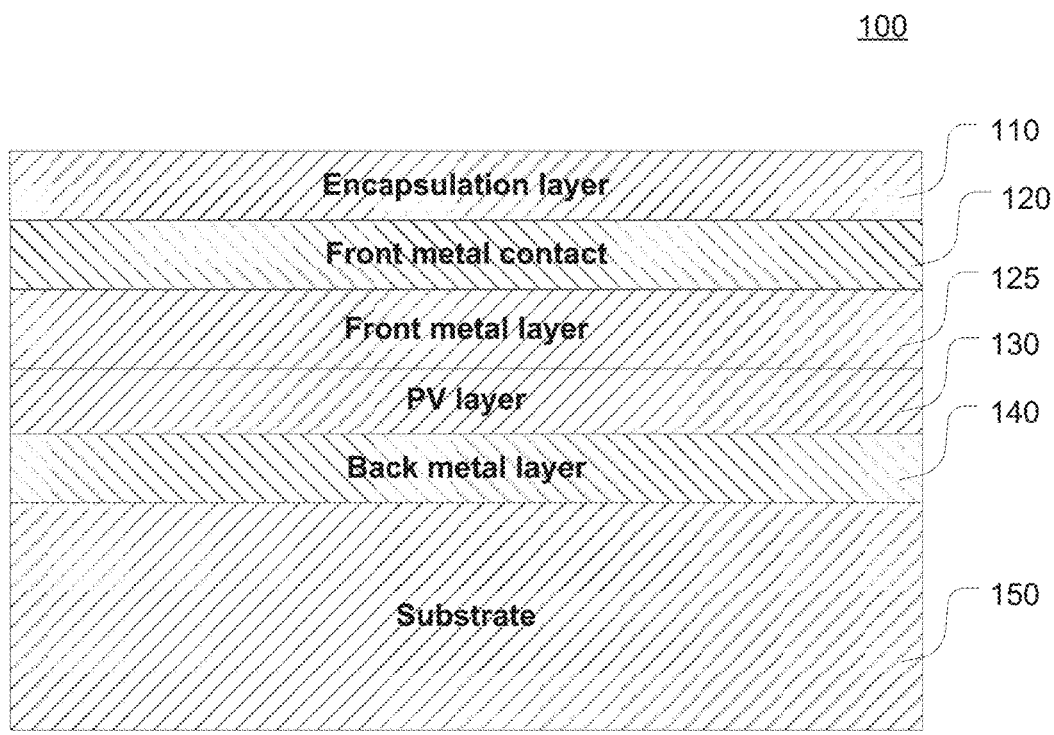
FIG. 1 illustrates the crosssection of a PV device along an extraction electrode of the PV cell in the PV device in accordance with the prior art.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Forming Front Metal Contact on Solar Cell with Enhanced Resistance to Stress

Overall, embodiments of the present disclosure provide solar devices having a cushion layer disposed between a front metal contact and a photovoltaic (PV) cell to protect the PV cell against stress impact from the front metal contact. The cushion layer effectively compensates the mismatch in material rigidity between the front metal contact and the PV layer and enhances the overall resilience of the PV cell. As a result, the risk of physical damage on the PV layer can be beneficially and significantly reduced.

Herein, the terms "solar panel," and "PV panel" are used interchangeably; the terms "solar cell" and "PV cell" are used interchangeably. Herein, the terms "front" "back" "top" and "under" are used with reference to the intended orientation of a PV cell when it is installed in position for energy conversion. For example, the front side of the PV cell is intended to face sunlight or an application light source.

The present disclosure is not limited to any specific configuration, structure, dimension, geometry, material composition, fabrication process or application of a solar cell. In some embodiments, the PV layer of the solar cell may include one or more thin film sub-layers based on GaAs, Copper Indium Gallium Selenide (CIGS), Cadmium Telluride (CdTe), amorphous Silicon, amorphous microcrystalline Tandem, thin-film polycrystalline Silicon, or etc. The substrate of the solar cell may be flexible or rigid and made of polymer, Silicon, glass, or etc.

Figure 2A:
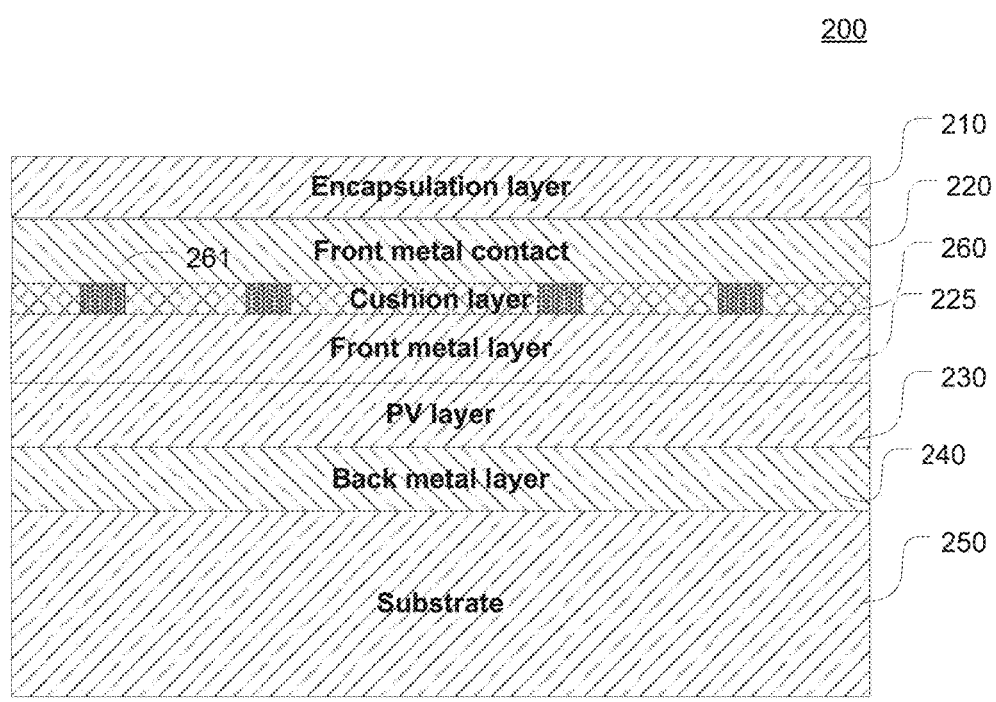
FIG. 2A illustrates the crosssection of an exemplary PV device along an extraction electrode of the PV cell in the PV device in accordance with an embodiment of the present disclosure.

FIG. 2A illustrates the crosssection of an exemplary PV device 200 along an extraction electrode of the PV cell in accordance with an embodiment of the present disclosure. The PV device 200 includes an encapsulation layer 210 as the front-most surface, a front metal contact 220, and the PV cell which includes a front metal layer 225, a PV layer 230, a back metal layer 240 and a substrate (or carrier layer) 250. The front metal layer 225 and the back metal layer 240 function as the opposite electrodes of the PV cell.

In some embodiments, an array of PV cells are electrically coupled in series to achieve higher power generation, where a front metal layer of a respective PV cell is electrically connected with a back metal layer of another PV cell for example.

It will be appreciated that each individual layer presented in FIGS. 1 and 2A may include multiple sub-layers depending on the particular embodiments. The front metal layer 225 corresponds to an extraction electrode of the PV cell. The front metal contact 220 is made of a metal strip, e.g., composed primarily of Cu and about 50 μm thick. The PV layer 230 includes a single layer or a stack of thin films, typically with a total thickness much less than the front metal contact 220, e.g., less than 10 μm.

In some embodiments, the PV layer includes a single crystalline thin film material and is substantially less rigid than the front metal layer. According to the present disclosure, a cushion layer 260 made of soft and flexible material is disposed between the front metal contact 220 and the PV cell, and more particularly the front metal layer 225, to compensate their difference in hardness (or rigidity). During solar module manufacturing, assembly, installation, or etc, an external force may cause a solar cell to bend or otherwise deformed. The front metal contact being bent tends to impose significant stress impact on the PV layer. Also, for example, during encapsulation, stress may arise from CTE mismatch of the material stacks among the solar cell, conductive adhesive, ribbon and encapsulation material. According to the present disclosure, the intermediate cushion layer 260 can at least partially absorb and so mitigate the mechanical stress impinging on the PV layer 230 through the front metal contact 220. Thereby, the PV layer 230 can be advantageously and effectively protected from physical damage induced by such mechanical stress. As a result, the cushioning effect can beneficially improve overall flexibility, productivity and quality of the PV cell.

The present disclosure is not limited to any specific material composition used as a cushion layer between a front metal contact and a PV cell. It will be appreciated that the cushion material and thickness are selected based on the hardness of the PV layer relative to the front metal contact. In some embodiments, the cushion layer 260 is made of a nonconductive material and has a plurality of vias 261 filled with a conductive material to provide electrical continuity between the front metal contact 220 and the PV layer 230. In some embodiments, the cushion layer is made of a polymer material and may have the same or similar material composition as the flexible substrate layer. However, in some other embodiments, the cushion layer 260 is made of a conductive material.

Figure 2B:
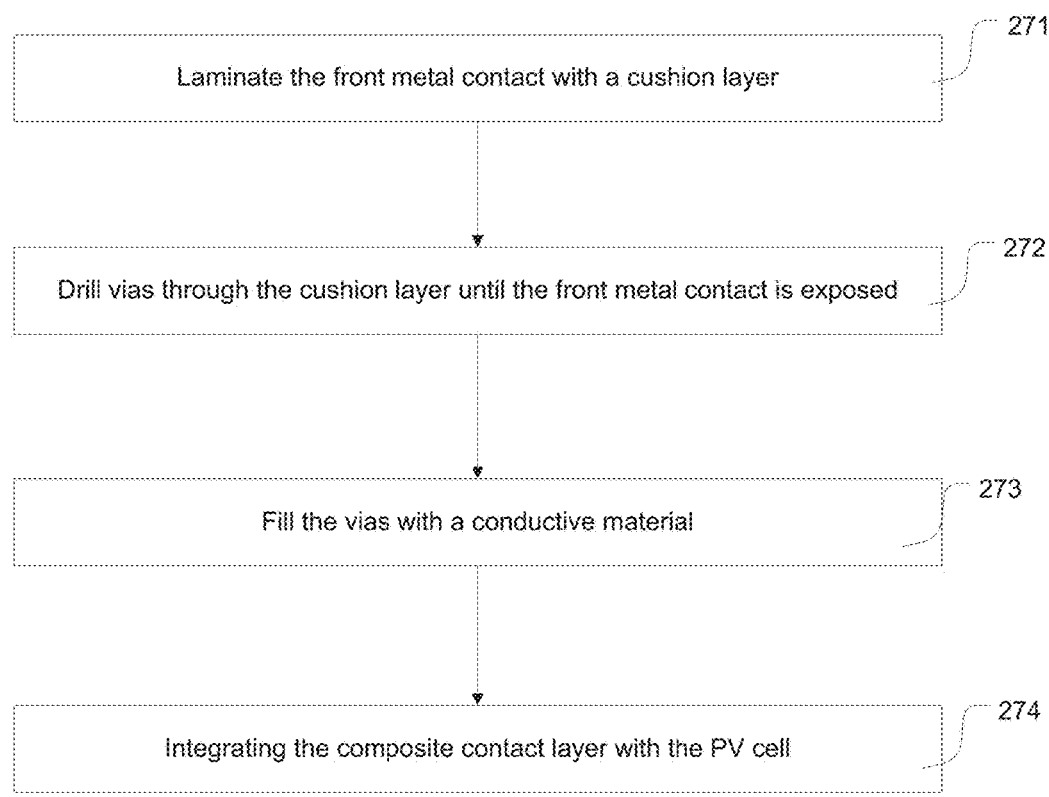
FIG. 2B is a flow chart depicting an exemplary process of forming a front metal contact on a PV cell that includes a cushion layer in accordance with an embodiment of the present disclosure.

The present disclosure is not limited to any specific method or process of integrating a cushion layer in a PV device. FIG. 2B is a flow chart depicting an exemplary process of forming a front metal contact that includes a cushion layer on a PV cell in accordance with an embodiment of the present disclosure. In this example, the front metal contact is laid on top of the extraction electrode operable to aggregate electrical current from multiple discrete electrodes that are distributed on a solar cell. Thus, the aggregated electrical current is conducted to external circuitry through the front metal contact.

At 271, a cushion layer made of nonconductive material is laminated on one side of the front metal contact. However, various other suitable mechanisms well known in the art can also be used to apply and bond a cushion layer onto the front metal contact without departing from the scope of the present disclosure.

At 272, a number of vias are formed on the cushion layer in selected locations to partially expose the back of the front metal contact. The vias can be formed in any suitable manner that is well known and according on the properties of the cushion layer and other relevant components of the PV cell, such as mechanical drilling, laser ablation, etching, and etc. The vias may be made in a variety of shapes and sizes. In some other embodiments, the vias are generated on the cushion layer before the cushion layer is attached to the front metal contact.

At 273, a conductive material is dispensed in the vias to form electrical contact with the front metal contact. For instance, the conductive material is in the form of ink or paste and mainly composed of a mixture of Ag and a polymer material. However, the present disclosure is not limited by the material composition of the conductive material for filling the vias. At 274, the composite contact layer, including the front metal contact and the cushion layer with vias, are integrated with the other layers of the PV device by attaching to the surface of the PV cell. Thus, as the cushion layer is nonconductive, the conductive filling in the vias provide electrical continuity between the PV cell and the front metal contact.

Figure 3:
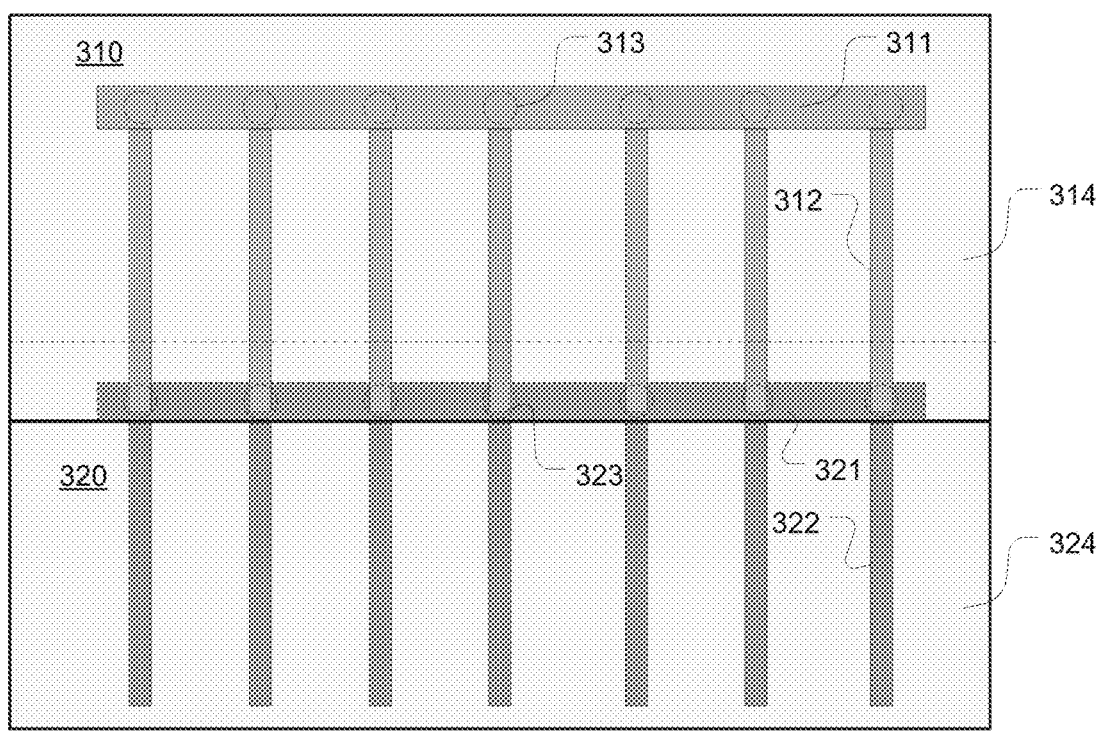
FIG. 3 illustrates a top view of an exemplary PV module including cushion layers disposed between the front contact layers and the PV cells in accordance with an embodiment of the present disclosure.

FIG. 3 illustrates a top view of an exemplary PV module 300 including cushion layers (not explicitly shown) disposed between the front contact layers 311 and 321 and the PV cells 310 and 320 in accordance with an embodiment of the present disclosure. In a basic form, the PV module 300 includes the two PV cells 310 and 320 electrically coupled in series. The front contact layers 311 and 321 (e.g., made of metal wire or ribbon) and disposed on top of the extraction electrodes (or bus bars) of the PV cells 310 and 320. As described in greater detail below, each PV cell 310 or 320 includes a front metal layer and a back metal layer disposed on opposite sides of the PV layer 314 or 324. The back contact layer is disposed atop the nonconductive flexible substrate which has vias filled with a conductive material (referred to as "back vias" herein). The two PV cells 310 and 320 overlap partially such that the front contact 321 laid on the bottom PV cell 320 are in direct contact with the conductive filling in the back vias of the top PV cell 310. In this manner, the bus bar 321 of the bottom PV cell 320 is electrically connected to the back contact layer of the top PV cell 310.

The present disclosure is not limited by the material composition, configuration and arrangement of the front electrodes (or front contact) of each PV cells. In this example, the front metal layer of each PV cell 310 or 320 is configured in a comb shape and includes two parts: a plurality of parallel finger electrodes (e.g., 312) distributed on top of the PV layer (e.g., 314)) and a bus bar connected to all the finger electrodes. The cushion layer is only disposed on top of the bus bar which has a much larger area, and thus more likely to impose stress on the PV layer (e.g., 314), than a finger electrode. However, it will be appreciated a cushion layer can be applied under any portion(s) of a front metal layer without departing the scope of the present disclosure. The vias on the cushion layer 311 are aligned with the finger electrodes but the present disclosure is not limited thereto. In one embodiment, each PV layer 314 or 324 includes one or more p-n junctions formed by doped GaAs-based thin films. A PV layer may be formed on the substrate various suitable thin film processes that is well known in the art, such as molecular beam epitaxy, metal-organic chemical vapor deposition, physical deposition, plating, etc.

FIGS. 4A-4D illustrate an exemplary process of integrating a cushion layer between a front metal contact and a PV cell in accordance with an embodiment of the present disclosure. For example, the PV cell has a similar front electrode configuration as described with reference to FIG. 3. FIG. 4A shows the top view and crosssection of the composite front metal contact 410 following lamination of the front metal contact and the cushion layer. The front metal contact 413 is made of a Cu ribbon, e.g., having a thickness of 50 mm and a width of 1 mm. The cushion layer is flexible and includes the combination of a pressure sensitive adhesive (PSA) layer 412 and a polyethylene terephthalate (PET) layer 411. For instance, the thickness of the cushion layer is around several or tens of micrometers.

FIG. 4B shows that a row of vias 420 are drilled through the cushion layer 411 and 412 until the Cu layer 413 is exposed. FIG. 4C shows that the conductive material 430 is dispensed in the vias, e.g., by deposition or injection. For instance, the vias are 400 mm in diameter, which is sufficient to form efficient electrical contact while does not cause the conductive filling to smear out of the composite front contact 410. In some embodiments, the conductive filling material is adhesive.

FIG. 4D shows that the composite front contact 410 is integrated with the PV cell including the finger electrodes 414, the PV layer 415, the back metal layer 417 and the substrate 416. For instance, the substrate is made of multiple layers and is about 100 μm in thickness; while the total thickness of the PV cell is about 110 μm. The finger electrodes and the bus bar may be formed on the PV layer surface by plating or any other suitable technique that is well known in the art. In this example, the bus bar is oriented perpendicular to the finger electrodes. The filled vias 420 of the front metal contact are aligned with and directly contact the finger electrodes 440.

In this example, the cushion layer is made of the same materials as the substrate. However, the present disclosure is not limited thereto. After the front metal contact is placed on the surface of the PV cell, the PV cell is subject to a thermal cure procedure to achieve a high bonding strength between the conductive filling and the front metal layer. Thereafter, an encapsulation layer is applied on top of the PV cell for purposes of protection against moisture and mechanical damage, insulating, anti-reflection, and etc.

It will be appreciated that each constituent of a PV device as shown in FIGS. 4A-4D may have various suitable material compositions and may be fabricated or integrated with the PV cell in any suitable manner that is well known in the art. Also, the sequence of integrating the various constituent layers varies depending on the particular embodiment.

Figure 5C:
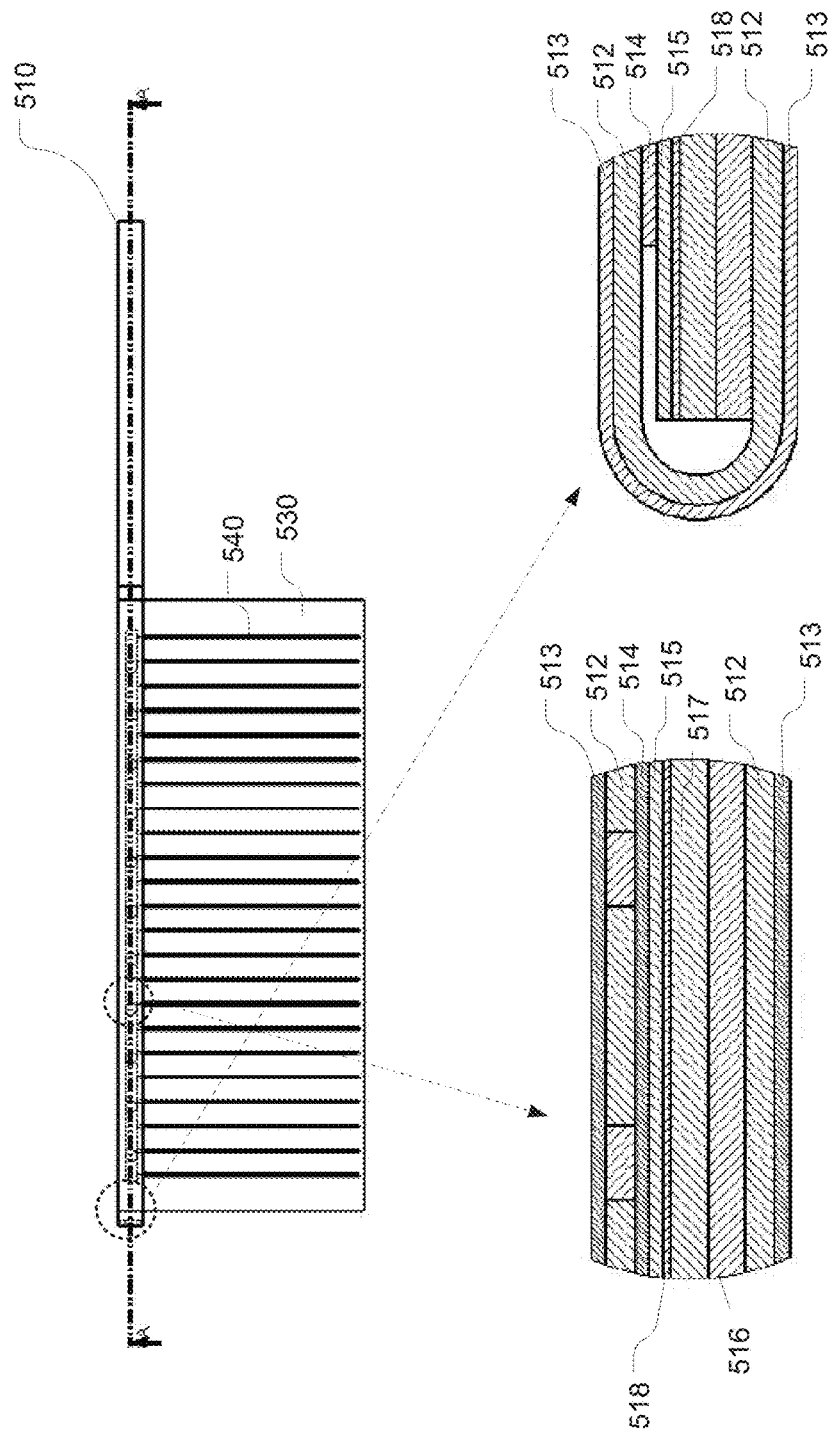

FIGS. 5A-5C illustrate another exemplary process of integrating a cushion layer between a front metal contact and a PV cell in accordance with an embodiment of the present disclosure. The PV cell in FIGS. 5A-5C has substantially the same configuration as the example shown in FIG. 4A-4C. The cushion layer is made of nonconductive flexible polymer but has a different material composition than the substrate.

In this example, the combination of the front metal contact 513, the cushion layer 512 and the release liner 511 is commercially available as an off-the-shelf product, for example a Cu tape bonded with a nonconductive layer (e.g., polyimide) and a release sheet. The Cu tape with the nonconductive layer 512 and the release liner are first prepared into a desired size, e.g., according to the design of the bus bar. FIG. 5A shows that vias 520 are generated in the cushion layer 512 and the release liner 511. FIG. 5B shows that the release liner 511 is removed, and the vias 520 are filled with a conductive material 530. Thus, the cushion layer in this example does not have an adhesive layer, which is different from the example shown in FIGS. 4A-4D.

FIG. 5C shows that the front metal contact is attached with the other components of the PV cell with the vias overlaying the finger electrodes. As a result, from front to back, the crosssection of the PV device along the bus bar includes the front metal contact 513, the cushion layer 512, the front metal layer 514, the PV layer 515, the back metal layer 518 and the composite substrate layer. For example, the substrate layer 516 includes a PSA layer 517 and a PET layer 516. Optionally, the lengthwise excess of the composite front contact is folded and wraps around the edge of the PV cell, as shown by the bottom two layers 512 and 513. An encapsulation layer (not shown) is then laid on top of the PV cell.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A photovoltaic assembly comprising:
    a photovoltaic cell configured to convert light energy to electrical energy, wherein said photovoltaic cell comprises:
        a front metal layer comprising a bus bar on a side along a length of said photovoltaic cell and multiple finger electrodes oriented perpendicular to and extending from said bus bar with one end connected to said bus bar,
        a photovoltaic layer disposed under said front metal layer, said front metal layer being disposed closer than said photovoltaic layer to a side of said photovoltaic cell intended to face light, and
        a substrate layer disposed under said photovoltaic layer;
    a front contact disposed above of said front metal layer and thereby above said bus bar and above the end of each of said finger electrodes connected to said bus bar, and said front contact configured to conduct electrical current originated from the photovoltaic cell to external circuitry;
    a cushion layer disposed between said front contact and said front metal layer thereby closer to said side of said photovoltaic cell intended to face light than said front metal layer, wherein said cushion layer includes a nonconductive material that is less rigid than said front contact and comprises a plurality of vias filled with a conductive material, wherein each filled via is aligned with and in direct contact with one finger electrode at the end of that finger electrode that is connected with said bus bar to conduct electrical current between said front contact and said photovoltaic layer via said front metal layer, and wherein an excess portion of said front contact and said cushion layer along said length of said photovoltaic cell wraps over an edge of said photovoltaic cell; and
    a back metal layer disposed between said photovoltaic layer and said substrate layer, said back metal layer being configured to interconnect said photovoltaic layer with another photovoltaic layer of a different photovoltaic cell in said photovoltaic assembly,
    wherein said nonconductive material of said cushion layer includes a flexible polymer material and said substrate layer includes the flexible polymer material.

2. The photovoltaic assembly as described in claim 1, wherein a rigidity of said cushion layer matches a rigidity of said substrate layer, and wherein said cushion layer is used to protect said photovoltaic cell from physical damage caused by tactile contact with said front contact.

3. The photovoltaic assembly as described in claim 1, wherein said flexible polymer material comprises polyethylene terephthalate (PET) combined with pressure sensitive adhesive (PSA).

4. The photovoltaic assembly as described in claim 1, wherein said photovoltaic layer is less than 10 μm in thickness and comprises a GaAs layer.

5. The photovoltaic assembly as described in claim 1, wherein said front contact comprises Cu and has a thickness of less than 50 μm.

6. The photovoltaic assembly as described in claim 1, wherein said front metal layer corresponds to an extraction electrode in said photovoltaic cell.

* * * * *